(12) United States Patent
Imai

(10) Patent No.: US 8,304,786 B2
(45) Date of Patent: Nov. 6, 2012

(54) LIGHT EMISSION DEVICE, LIGHT EMISSION DEVICE DRIVING METHOD, AND PROJECTOR

(75) Inventor: Yasutaka Imai, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 13/370,638

(22) Filed: Feb. 10, 2012

(65) Prior Publication Data

US 2012/0140190 A1 Jun. 7, 2012

Related U.S. Application Data

(63) Continuation of application No. 12/792,090, filed on Jun. 2, 2010, now Pat. No. 8,139,618.

(30) Foreign Application Priority Data

Jun. 18, 2009 (JP) ................................. 2009-144941

(51) Int. Cl.
*H01L 27/15* (2006.01)
*H01S 5/00* (2006.01)

(52) U.S. Cl. ...................................... 257/79; 372/46.01

(58) Field of Classification Search ................... 372/39, 372/46.01, 38.05; 257/88–103, 431–444
See application file for complete search history.

(56) References Cited

U.S. PATENT DOCUMENTS

| | | | |
|---|---|---|---|
| 5,663,975 A | 9/1997 | Yoshida et al. | |
| 5,809,052 A | 9/1998 | Seko et al. | |
| 6,459,714 B1 | 10/2002 | Narui et al. | |
| 6,741,625 B2 | 5/2004 | Hirata | |
| 7,366,220 B2 | 4/2008 | Takabayashi | |
| 2006/0209911 A1* | 9/2006 | Takabayashi | 372/20 |
| 2007/0165685 A1* | 7/2007 | Mizuuchi et al. | 372/38.05 |
| 2009/0310630 A1* | 12/2009 | Takabayashi | 372/20 |

FOREIGN PATENT DOCUMENTS

| | | |
|---|---|---|
| JP | 04-115585 | 4/1992 |
| JP | 05-335669 | 12/1993 |
| JP | 11-064789 | 3/1999 |
| JP | 2009-238826 | 10/2009 |
| JP | 2009-238828 | 10/2009 |
| JP | 2009-238843 | 10/2009 |
| JP | 2009-238845 | 10/2009 |
| JP | 2009-238846 | 10/2009 |

* cited by examiner

*Primary Examiner* — Jessica Stultz
*Assistant Examiner* — Phillip Nguyen
(74) *Attorney, Agent, or Firm* — Harness, Dickey & Pierce, P.L.C.

(57) ABSTRACT

A light emission device includes: first and second clad layers sandwiching an active layer; a first electrode connected with the first clad layer; and second electrodes connected with the second clad layer, at least part of the active layer forms gain areas corresponding to the second electrodes, the gain areas extend from a first side to a second side of the active layer while inclined to a vertical of the first side, at least first and second gain areas form a set of gain areas and a plurality of sets are provided, the first and second gain areas in each set are disposed perpendicular to a direction extending from the first side to the second side, the second electrodes above the first gain areas are interconnected by a first common electrode, and the second electrodes above the second gain areas are interconnected by a second common electrode.

6 Claims, 9 Drawing Sheets

LIGHT EMISSION DEVICE, LIGHT EMISSION DEVICE DRIVING METHOD, AND PROJECTOR

CROSS-REFERENCE TO RELATED APPLICATIONS

This is a continuation application of U.S. Ser. No. 12/792,090 filed Jun. 2, 2010 which claims priority to Japanese Patent Application No. 2009-144941 filed Jun. 18, 2009, all of which are incorporated by reference herein in their entireties.

BACKGROUND

1. Technical Field

The present invention relates to a light emission device, a light emission device driving method, and a projector.

2. Related Art

Recently, a laser device capable of emitting laser beams having high luminance and preferable color reproducibility has been expected as a light emission device suited for a light source of a display apparatus such as a projector and a display. According to this laser device, however, speckle noise generated by mutual interference between irregular reflection lights on a screen surface can be a problem in some cases. For overcoming this problem, JP-A-11-64789 proposes a method for reducing speckle noise by moving a screen and varying speckle patterns, for example.

However, the method disclosed in JP-A-11-64789 introduces other problems such as limitation to the type of screen, the need of a motor for moving the screen and other components, and generation of noise from the motor and the like.

In addition, for meeting the recent demand for high output, JP-A-4-115585 proposes a method for arraying a light source.

The method shown in JP-A-4-115585 uses a laser device as a light emission device for the light source. Thus, the problem of speckle noise still arises.

SUMMARY

An advantage of some aspects of the invention is to provide a novel type of arrayed light emission device and driving method of the light emission device capable of reducing speckle noise and increasing output. It is another advantage of some aspects of the invention to provide a projector including the light emission device.

A light emission device according to a first aspect of the invention includes: a first clad layer; an active layer disposed above the first clad layer; a second clad layer disposed above the active layer; a first electrode electrically connected with the first clad layer; and second electrodes electrically connected with the second clad layer. At least a part of the active layer forms a plurality of gain areas. The plural second electrodes are provided in correspondence with the plural gain areas. The plural gain areas extend from a first side of the active layer to a second side of the active layer opposed to the first side while inclined to a vertical line of the first side in the plan view. At least a first gain area and a second gain area included in the plural gain areas form a set of gain areas. A plurality of the sets of the gain areas are provided. The first gain area and the second gain area included in each set of the gain areas are disposed in this order in a second direction perpendicular to a first direction extending from the first side to the second side in the plan view. The second electrodes disposed above the plural first gain areas are electrically connected with one another by a first common electrode. The second electrode disposed above the plural second gain areas are electrically connected with one another by a second common electrode.

According to this structure, the light emission device which is arrayed and capable of reducing speckle noise and achieving high output can be provided.

In the following description of the invention, a term "above" is used in sentences such as "a particular object (hereinafter referred to as B) is provided above another particular object (hereinafter referred to as A)". According to the description of the invention, this sentence contains both a condition in which the B is provided directly on the A and a condition in which the B is provided above the A with a further object interposed between B and A.

In addition, in the description of the invention, a phrase "electrically connected" is used in sentences such as "a particular component (hereinafter referred to as D component) is electrically connected with another particular component (hereinafter referred to as C component). According to the description of the invention, this sentence contains both a condition in which the C component and the D component are electrically connected with each other by direct contact and a condition in which the C component and the D component are electrically connected with each other via a further component interposed between the C and D components.

the light emission device of the first aspect may be configured such that each of the plural sets of the gain areas further includes a third gain area. The first gain area, the second gain area, and the third gain area included in each of the plural sets of the gain areas may be disposed in this order in the second direction in the plan view. The second electrodes disposed above the plural third gain areas may be electrically connected with one another by a third common electrode.

According to this structure, the light emission device which is arrayed and capable of reducing speckle noise and achieving high output can be provided.

The light emission device of the first aspect may be configured such that an end surface on the first side and an end surface on the second side do not overlap with each other in each of the plural gain areas in the plan view as viewed from the first side.

According to this structure, oscillation of laser beams generated in the first gain areas and the second gain areas can be securely reduced or prevented.

The light emission device of the first aspect may be configured such that the end surface on the first side is shifted from the end surface on the second side in the second direction in each of the plural gain areas. The end surface on the first side in the first gain area may overlap with the end surface on the second side in the second gain area adjacent to the first gain area in the plan view as viewed from the first side.

According to this structure, each distance between the first gain areas and the second gain areas decreases, and the light emission density increases. Thus, the high-output and compact light emission device can be provided.

The light emission device of the first aspect may be configured such that the second electrodes contact a contact layer allowing ohmic contact with the second electrodes. Each plane shape of the plural gain areas may be the same as each plane shape of the contact surfaces of the second electrodes in contact with the contact layer.

According to this structure, the contact resistance of the second electrodes can be reduced by the contact layer.

The light emission device of the first aspect may be configured such that the first common electrode and the second common electrode are conductive layers. The first common electrode and the second common electrode may extend in the second direction in the plan view.

According to this structure, the light emission device can be composed of one chip.

A method for driving the light emission device of the first aspect, the method includes: supplying voltage to the first common electrode such that lights can be emitted from the respective end surfaces in the plural first gain areas; and stopping the supply of voltage to the first common electrode and supplying voltage to the second common electrode such that lights can be emitted from the respective end surfaces in the plural second gain areas.

According to this light emission device driving method, the light emission device which is arrayed and capable of reducing speckle noise and achieving high output can be driven by the method.

A projector according to a second aspect of the invention includes: the light emission device according to the first aspect of the invention; a light modulation device which modulates light emitted from the light emission device according to image information; and a projection device which projects an image formed by the light modulation device.

According to this projector, speckle noise can be reduced, and thus a clear image can be displayed.

BRIEF DESCRIPTION OF THE DRAWINGS

The invention will be described with reference to the accompanying drawings, wherein like numbers reference like elements.

DESCRIPTION OF EXEMPLARY EMBODIMENT

1. Light Emission Device

Figure 1:
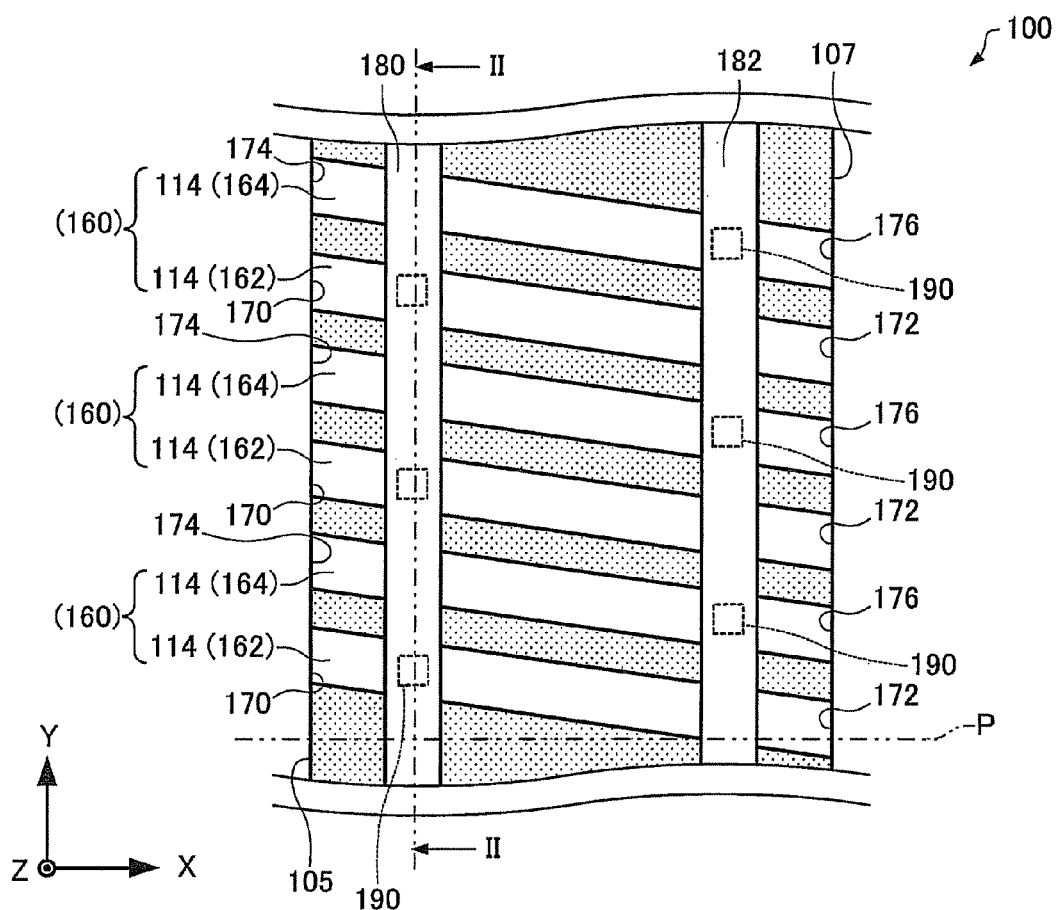
FIG. 1 is a plan view schematically showing a light emission device according to an embodiment.
Figure 2:
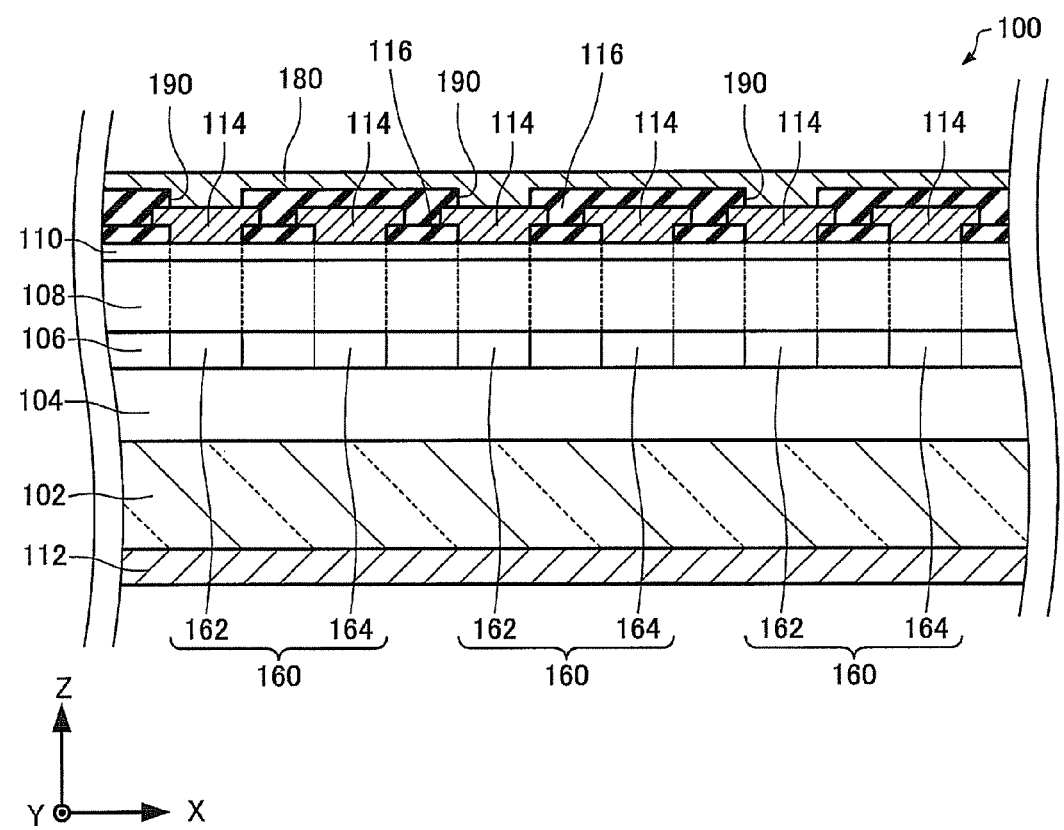
FIG. 2 is a cross-sectional view schematically illustrating the light emission device according to the embodiment.

A light emission device 100 according to an embodiment of the invention is now described with reference to the drawings. FIG. 1 is a plan view schematically illustrating the light emission device 100. FIG. 2 is a cross-sectional view schematically illustrating the light emission device 100 taken along a line II-II in FIG. 1. FIG. 1 does not show insulation portions 116 for easy understanding of the figure. In this embodiment, the light emission device 100 constituted by a semiconductor light emission device in InGaAlP (red) will be discussed.

As illustrated in FIGS. 1 and 2, the light emission device 100 includes a first clad layer 104, an active layer 106, a second clad layer 108, a first electrode 112, second electrodes 114, a first common electrode 180, and a second common electrode 182. The light emission device 100 can further include a substrate 102, a contact layer 110, and the insulation portions 116.

The substrate 102 is a first conductive type (such as n-type) GaAs substrate, for example.

The first clad layer 104 is provided on the substrate 102. The first clad layer 104 is an n-type AlGaP layer, for example. Though not shown in the figure, a buffer layer may be formed between the first substrate 102 and the first clad layer 104. The buffer layer is an n-type GaAs layer, an InGaP layer or the like. The buffer layer increases crystallinity of the layers formed above the buffer layer.

The active layer 106 is provided on the first clad layer 104. The active layer 106 has multiple quantum well (MQW) structure which laminates three layers of quantum well structure constituted by InGaP well layer and InGaAlP barrier layer, for example. The active layer 106 has a rectangular parallelepiped shape (including cube shape) or other shapes. As illustrated in FIG. 1, the active layer 106 has a first side 105 and a second side 107. The first side 105 and the second side 107 are opposed to each other. According to the example shown in the figure, the first side 105 and the second side 107 extend parallel with each other.

Figure 10:
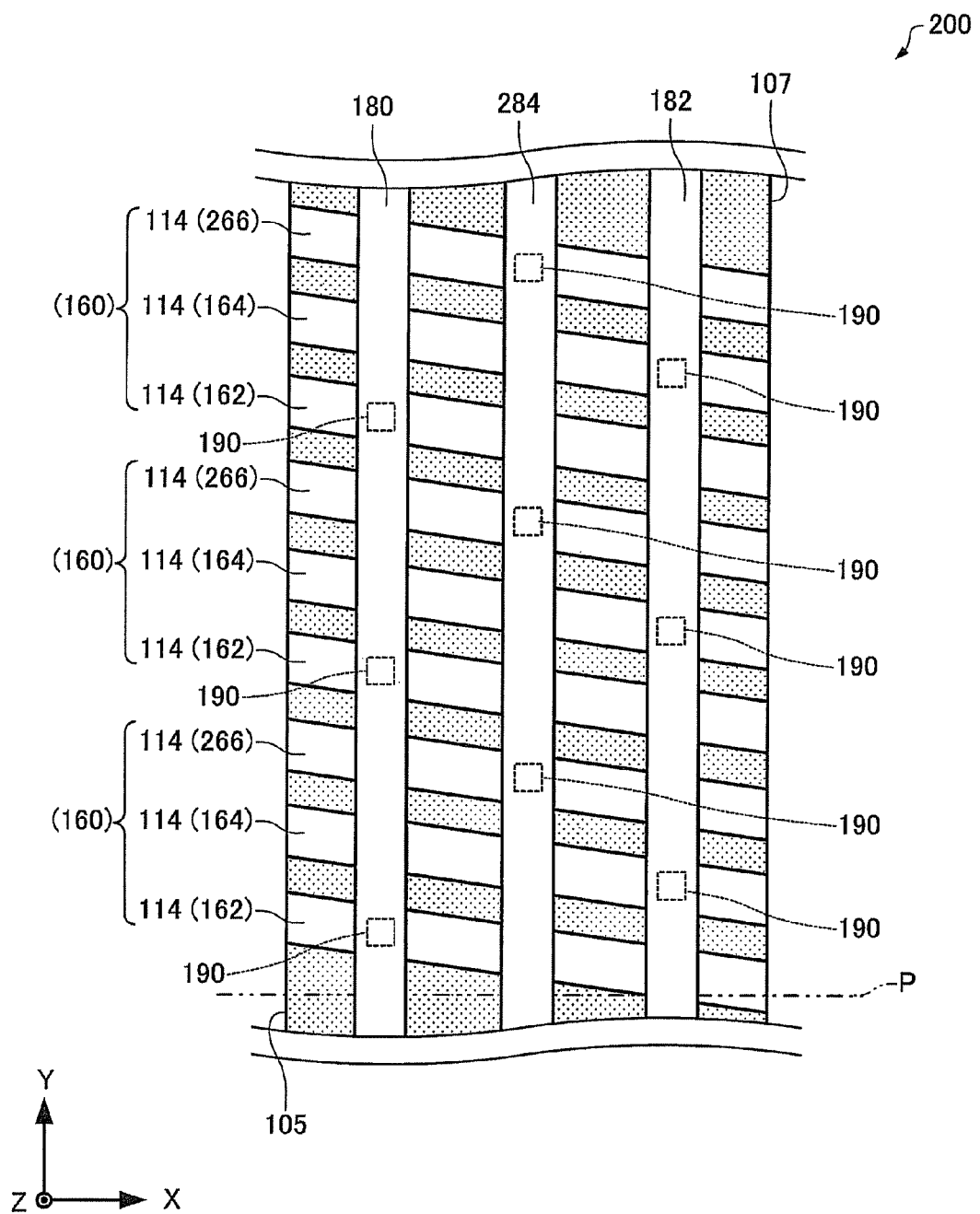
FIG. 10 is a plan view schematically illustrating a light emission device according to a first modified example of the embodiment.

A part of the active layer 106 constitutes a plurality of gain areas. A first gain area 162 and a second gain area 164 included in the plural gain areas constitute each set of gain areas 160 (gain area set 160). That is, each set of the gain area sets 160 has the two gain areas 162 and 164. Though not shown in the figure, each set of the gain area sets 160 may have three or more gain areas (see FIG. 10 showing a first modified example described later) with no specific limitation to the number of the gain areas.

As illustrated in the plan view of FIG. 1, the gain areas 162 and 164 extend from the first side 105 to the second side 107 while inclined to a vertical line P of the first side 105. This arrangement reduces or prevents oscillation of laser beams generated in the gain areas 162 and 164. According to the example shown in the figure, the first gain areas 162 and the second gain areas 164 are inclined to the vertical line P at the same angle. It is therefore considered that the first gain areas 162 and the second gain areas 164 extend parallel with one another. Each shape of the gain areas 162 and 164 in the plan view is parallelogram, for example.

Each of the first gain areas 162 has a first end surface 170 disposed on the first side 105, and a second end surface 172 disposed on the second side 107. According to the example shown in the figure, the first end surface 170 is shifted from the second end surface 172 in a second direction (+Y direction) perpendicular to a first direction (+X direction) extending from the first side 105 to the second side 107. The end surfaces 170 and 172 can be provided as emission slopes for emitting lights generated in the first gain areas 162. Each of the second gain areas 164 has a third end surface 174 disposed on the first side 105, and a fourth end surface 176 disposed on the second side 107. According to the example shown in the figure, the third end surface 174 is shifted from the fourth end surface 176 in the second direction. The end surfaces 174 and 176 can be provided as emission slopes for emitting lights generated in the second gain areas 164. In this case, it is preferable that each reflectance of the sides 105 and 107 is as small as 0% or close to 0% in the wavelength range of the lights generated in the gain areas 162 and 164. For example, though not shown in the figure, the reflectance of the sides 105 and 107 can be decreased by covering the sides 105 and 107 with anti-reflection film. The anti-reflection film is dielectric multilayer film, for example. More specifically, the anti-reflection film may be multilayer film produced by laminating $SiO_2$ layer and SiON layer in this order from the first side 105. Moreover, though not shown in the figure, emission of lights can be made allowed only from either the first end surface 170 or the second end surface 172 of each of the first gain areas 162, for example, by providing reflection film (total reflection film or dielectric multilayer film mirror) on either the first side 105 or the second side 107.

The gain area sets 160 are plural sets of gain areas disposed in the second direction (+Y direction). The example shown in the figure includes three sets of the gain area sets 160, but the number of sets of the gain area sets 160 is not specifically limited. The first gain area 162 and the second gain area 164 included in each set of the gain area sets 160 are disposed in this order in the second direction. It is thus considered that the first gain area 162 and the second gain area 164 are alternately disposed.

Figure 3:
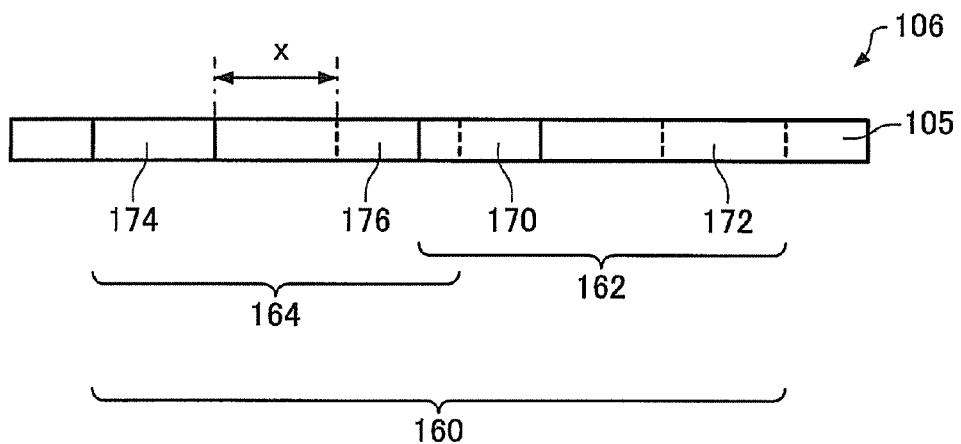
FIG. 3 illustrates an active layer of the light emission device according to the embodiment as viewed from a first side.

FIG. 3 is a plan view illustrating the active layer 106 as viewed from the first side 105. As illustrated in FIG. 3, the first end surface 170 and the second end surface 172 do not overlap with each other in the first gain area 162. Similarly, the third end surface 174 and the fourth end surface 176 do not overlap with each other in the second gain area 164. According to this arrangement, direct multiple reflection of lights generated in the first gain area 162 does not occur between the first end surface 170 and the second end surface 172. Similarly, direct multiple reflection of lights generated in the second gain area 164 does not occur between the third end surface 174 and the fourth end surface 176. As a result, direct resonator is not formed, and thus oscillation of laser beams generated in the gain areas 162 and 164 can be reduced or prevented. In this case, a shift width x between the first end surface 170 and the second end surface 172 in the first gain area 162, for example, may have any length as long as the length has a positive value as illustrated in FIG. 3.

Though not shown in FIG. 3, the first end surface 170 of one of the two adjoining first gain areas 162 (the adjoining first gain areas 162 with the second gain area 164 interposed therebetween) does not overlap with the second end surface 172 of the other first gain area 162 in the plan view as viewed from the first side 105 (see FIG. 1). Similarly, the third end surface 174 of one of the two adjoining second gain areas 164 does not overlap with the fourth end surface 176 of the other second gain area 164. When the first end surface 170 of the one first gain area 162 overlaps with the second end surface 172 of the other first gain area 162, there is a possibility that direct multiple reflection occurs even between the end surfaces of the different types of the gain areas depending on the efficiency of confinement of the gain areas. However, in case of the arrangement of the end surfaces in this embodiment, direct multiple reflection does not occur, and thus oscillation of laser beams generated in the gain areas 162 and 164 can be more securely reduced or prevented.

On the other hand, the first end surface 170 of the first gain area 162 can overlap with the fourth end surface 176 of the second gain area 164 in the plan view as viewed from the first side 105 as illustrated in FIG. 3. According to this arrangement, the distance between the first gain area 162 and the second gain area 164 decreases, and thus light emission density increases. As will be described later, the first gain area 162 and the second gain area 164 alternately emit lights. Thus, direct multiple reflection does not occur between the end surfaces 170 and 176 even when the end surfaces 170 and 176 overlap with each other.

As illustrated in FIG. 2, the second clad layer 108 is provided on the active layer 106. The second clad layer 108 is a second conductive type (such as p-type) AlGaP layer or the like.

For example, the p-type second clad layer 108, the active layer 106 not doped, and the n-type first clad layer 104 constitute a pin diode. Each of the first clad layer 104 and the second clad layer 108 has a larger band gap width and a smaller refractive index than those of the active layer 106. The active layer 106 has a function of amplifying light. The first clad layer 104 and the second clad layer 108 between which the active layer 106 is sandwiched have a function of confining injection carriers (electrons and positive holes) and light.

When forward bias voltage of a pin diode is applied between the first electrode 112 and the second electrodes 114 by the light emission device 100, the electrons and positive holes are re-combined in the gain areas 162 and 164 of the active layer 106. This re-combination causes light emission, and induced stimulated emission which occurs from the start point corresponding to the light emission position in a manner of chain reaction. As a result, the light intensity is amplified in the gain areas 162 and 164. For example, a part of lights generated in the first gain areas 162 is amplified within the first gain areas 162, and emitted through the first end surfaces 170 or the second end surfaces 172. Similarly, a part of lights generated in the second gain area 164 is amplified within the second gain areas 164, and emitted through the third end surfaces 174 or the fourth end surfaces 176. It is thus considered that the gain areas 162 and 164 are light propagation areas (waveguide areas).

The contact layer 110 is provided on the second clad layer 108. The contact layer 110 is constituted by a layer allowing ohmic contact with the second electrodes 114, for example. The contact layer 110 reduces contact resistance of the second electrodes 114. The contact layer 110 is a p-type GaAs layer, for example.

The first electrode 112 is formed on the entire area of the lower surface of the substrate 102. The first electrode 112 can contact the layer allowing ohmic contact with the first electrode 112 (the substrate 102 in the example shown in the figure). The first electrode 112 is electrically connected with the first clad layer 104 via the substrate 102. The first electrode 112 is one of the electrodes for driving the light emission device 100. The first electrode 112 is produced by laminating a Cr layer, an AuGe layer, an Ni layer, and an Au layer in this order from the substrate 102, for example. A second contact layer (not shown) may be formed between the first clad layer 104 and the substrate 102 and exposed by dry-etching or other method. In this case, the first electrode 112 is disposed on the second contact layer. By this method, single-sided electrode structure can be formed. This structure is particularly effective when the substrate 102 has insulation characteristics.

The second electrodes 114 are disposed on the contact layer 110. The plural second electrodes 114 are provided in correspondence with the plural gain areas 162 and 164. The surfaces of the second electrodes 114 contacting the contact layer 110 have plane shapes similar to those of the gain areas 162 and 164. In this case, the current paths between the electrodes 112 and 114 are determined by the plane shapes of the second electrodes 114, for example, and the plane shapes of the gain areas 162 and 164 are determined in accordance with the determined current paths. The second electrodes 114 are electrically connected with the second clad layer 108 via the contact layer 110. The second electrodes 114 correspond to the other electrode for driving the light emission device 100. The second electrodes 114 are produced by laminating a Cr layer, an AuZn layer, and an Au layer in this order from the contact layer 110, for example.

As illustrated in FIG. 2, the insulation portions 116 are disposed on the contact layer 110 and between the plural second electrodes 114. It is thus considered that the insulation portions 116 contact the contact layer 110 positioned above the active layer 106 not having the gain areas 162 or 164. Each of the insulation portions 116 is an SiN layer, an $SiO_2$ layer, or a polyimide layer, for example.

The first common electrode 180 and the second common electrode 182 are formed above the second electrodes 114. The first common electrode 180 electrically connects the second electrodes 114 disposed above the plural first gain areas 162. According to the example shown in FIG. 2, contact holes 190 are formed on the insulation portions 116 positioned above the first gain areas 162, and the first common electrode 180 and the second electrodes 114 are connected by the contact holes 190 filled with the first common electrode 180. Similarly, the second common electrode 182 electrically connects the second electrodes 114 disposed above the plural second gain areas 164. It is thus considered that the insulation portions 116 are provided above the second electrodes 114 in the areas other than the contact holes 190. As illustrated in FIG. 1, the common electrodes 180 and 182 extend in the second direction (+Y axis direction) in the plan view, for example. That is, the common electrodes 180 and 182 cross the gain areas 162 and 164 (the second electrodes 114). The common electrodes 180 and 182 are conductive layers, and more specifically, layers of material containing copper, aluminum, gold, and others, for example. Though not shown in the figure, the plural second electrodes 114 may be electrically connected with one another by wire bonding.

Figure 4:
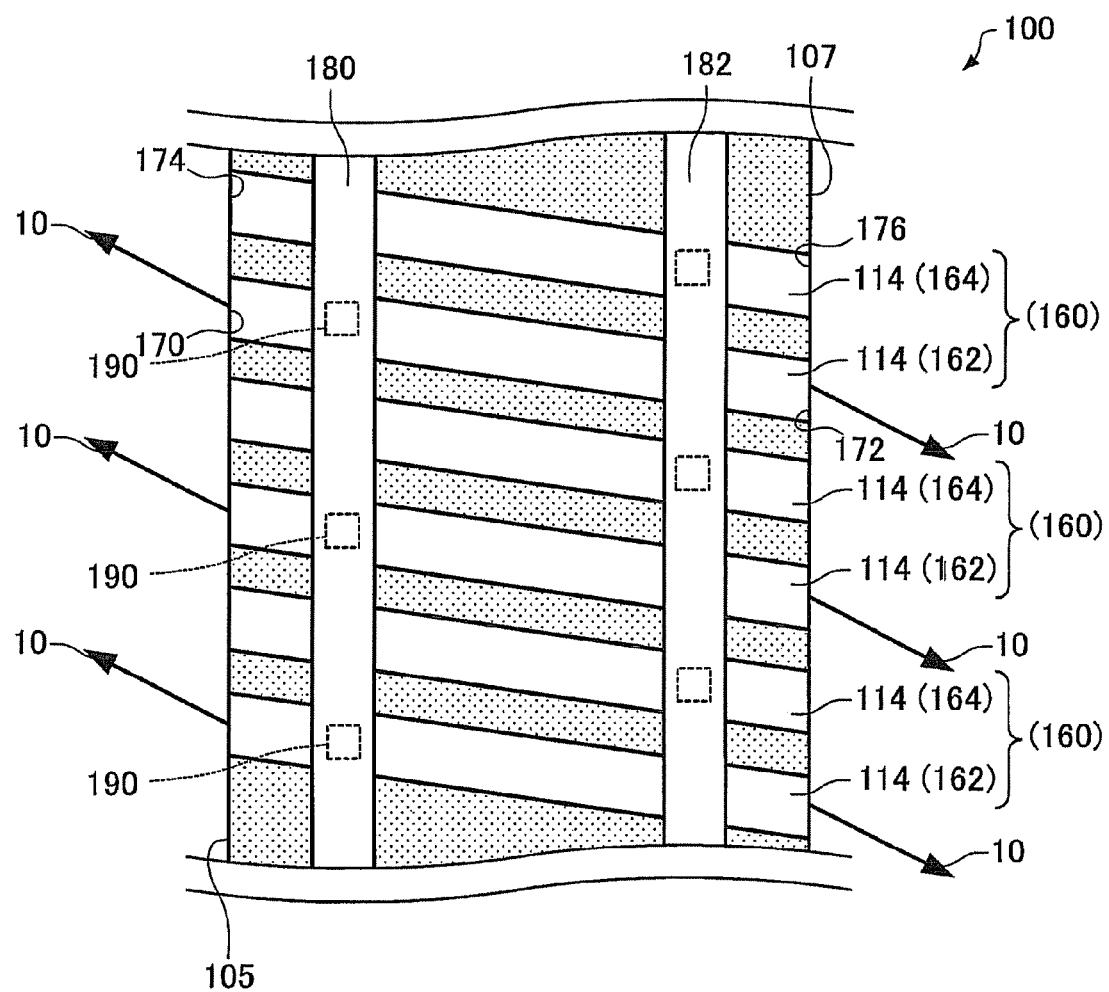
FIG. 4 is a plan view schematically illustrating the light emission device according to the embodiment.
Figure 5:
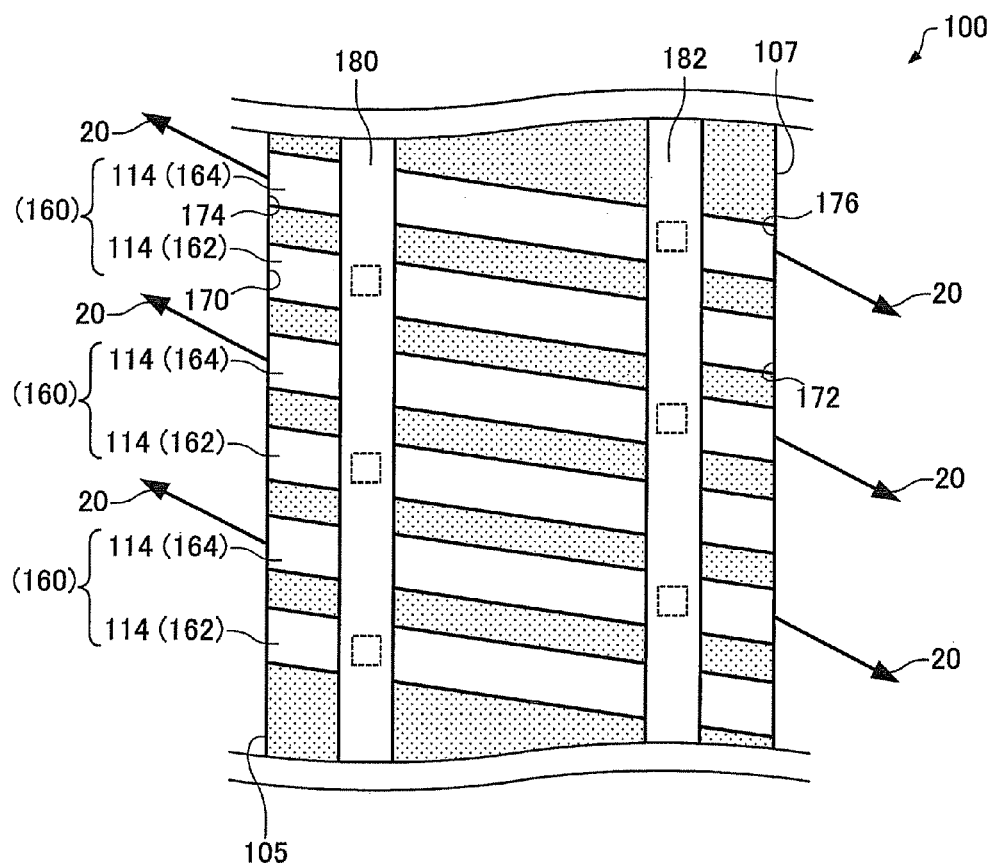
FIG. 5 is a plan view schematically illustrating the light emission device according to the embodiment.

A driving method of the light emission device 100 is now explained. FIGS. 4 and 5 illustrate the driving method of the light emission device 100.

Initially, as illustrated in FIG. 4, voltage is supplied from an external power source (not shown) to the first common electrode 180. As a result, lights 10 are emitted from the respective end surfaces 170 and 172 of the plural first gain areas 162.

Then, as illustrated in FIG. 5, voltage supply to the first common electrode 180 is cut off to stop light emission from the end surfaces 170 and 172 of the first gain areas 162. Subsequently, voltage is supplied to the second common electrode 182. As a result, lights 20 are emitted from the respective end surfaces 174 and 176 of the plural second gain areas 164.

These steps are repeated to alternately apply the lights 10 and 20 to a light receiving body. In this case, the density of the emitted lights can be increased by instantaneous execution of the steps.

While the light emission device 100 in InGaAlP has been described in this embodiment, the light emission device 100 may be constituted by materials in various systems capable of forming light emission gain areas. Incase of semiconductor material, semiconductor in AlGaN, InGaN, GaAs, AlGaAs, InGaAs, InGaAsP, ZnCdSe, or in others may be employed.

The light emission device 100 according to this embodiment is applicable to a light source for a projector, a display, an illumination device, a measuring device and the like.

The light emission device 100 in this embodiment has the following characteristics, for example.

According to the light emission device 100, the gain areas 162 and 164 extend from the first side 105 to the second side 107 while inclined to the vertical line P as described above. Moreover, the end surfaces 170 and 174 on the first side 105 do not overlap with the end surfaces 172 and 176 on the second side 107 in the gain areas 162 and 164, respectively, in the plan view as viewed from the first side 105. Accordingly, oscillation of laser beams generated in the gain areas 162 and 164 can be reduced or prevented, and thus speckle noise can be decreased. Furthermore, before emitted to the outside, the lights generated in the gain areas 162 and 164 receive gains while traveling through the gain areas 162 and 164. Thus, higher output lights can be produced by the light emission device 100 than by a typical LED (light emitting diode) in related art. Accordingly, the light emission device provided in this embodiment is a novel light emission device capable of reducing speckle noise and achieving high output.

According to the light emission device 100, the first end surface 170 of the first gain area 162 and the fourth end surface 176 of the second gain area 164 adjacent to the first gain area 162 overlap with each other in the plan view as viewed from the first side 105. In this case, the distance between the first gain area 162 and the second gain area 164 decreases, and the light emission density increases. Thus, the light emission device 100 becomes a high-output and compact device. In addition, lights are alternately emitted from the first gain areas 162 and the second gain areas 164 as explained above. Accordingly, direct multiple reflection does not occur between the first end surfaces 170 and the fourth end surfaces 176 even when both the surfaces 170 and 176 overlap with each other, and thus oscillation of laser beams can be reduced or prevented.

According to the light emission device 100, lights are alternately emitted from the first gain areas 162 and the second gain areas 164. Thus, thermal interference between the adjoining gain areas 162 and 164 can be prevented or reduced. The thermal interference herein refers to transmission of heat generated within one gain area to another gain area next to the one gain area. The thermal interference lowers light output and changes light emission wavelength in some cases. However, this problem does not occur in the light emission device 100.

According to the light emission device 100, the plural second electrodes 114 can be electrically connected with one another by the common electrodes 180 and 182 constituted by conductive layers. Thus, the light emission device 100 can be composed of one chip. When constitution by one chip is difficult, the plural second electrodes can be electrically connected by wire bonding, for example.

2. Manufacturing Method of Light Emission Device

The manufacturing method of the light emission device 100 according to this embodiment is now described with reference to the drawings. FIGS. 6 through 9 are cross-sectional views schematically illustrating respective steps for manufacturing the light emission device 100.

Figure 6:
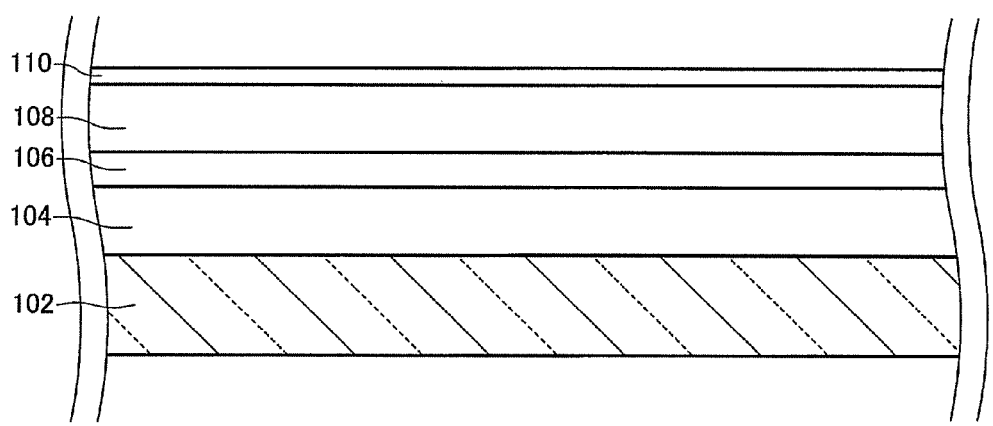
FIG. 6 is a cross-sectional view schematically illustrating a manufacturing step of the light emission device according to the embodiment.

As illustrated in FIG. 6, epitaxial growths of the first clad layer 104, the active layer 106, the second clad layer 108, and the contact layer 110 are allowed on the substrate 102 in this order. For epitaxial growths, MOCVD (metal organic chemical vapor deposition) method, MBE (molecular beam epitaxy) method or the like is used.

Figure 7:
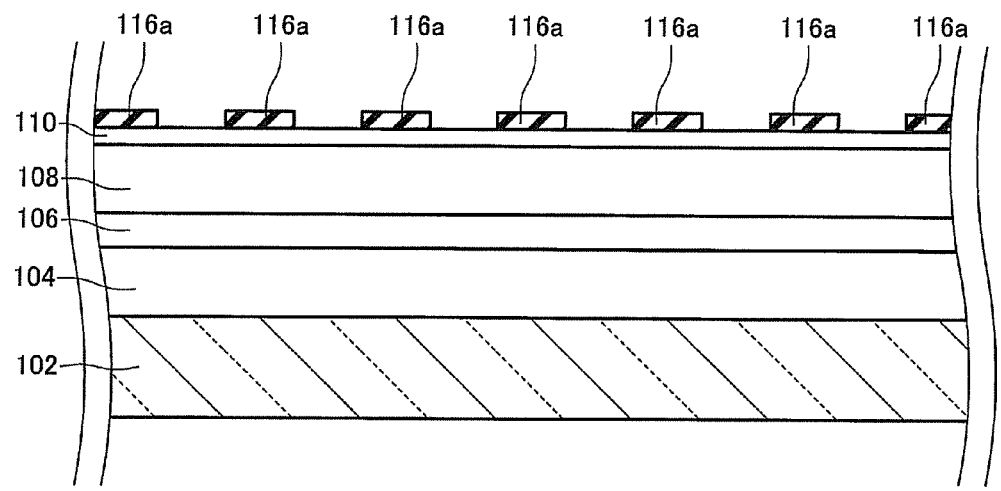
FIG. 7 is a cross-sectional view schematically illustrating a manufacturing step of the light emission device according to the embodiment.

As illustrated in FIG. 7, first parts 116a of the insulation portions 116 are formed on the contact layer 110. More specifically, the first parts 116a are produced by forming an insulation layer (not shown) on the entire area and patterning the insulation layer. The contact layer 110 is exposed by the patterning. The insulation layer is formed by CVD (chemical vapor deposition) method, coating method or other method. The patterning is performed by photolithography, etching or other technology.

Figure 8:
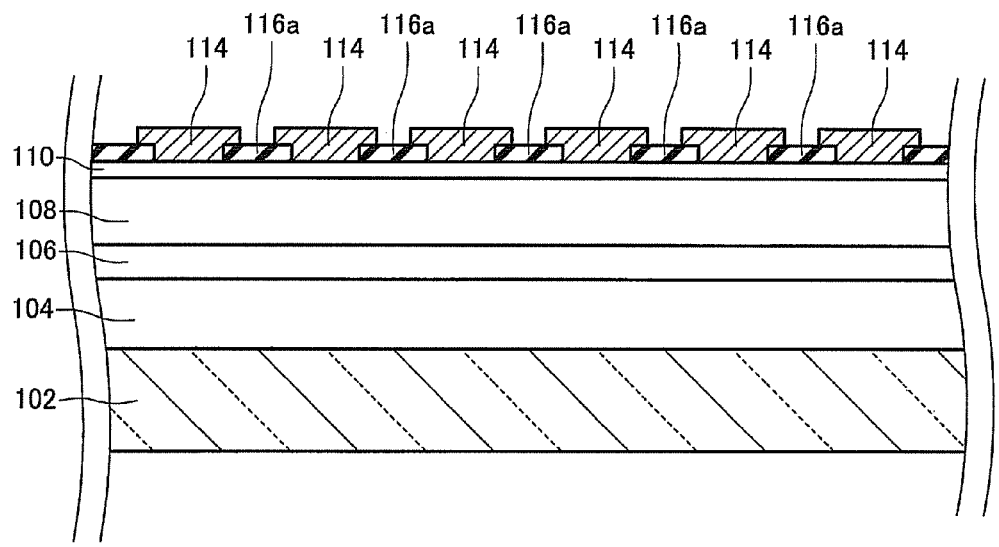
FIG. 8 is a cross-sectional view schematically illustrating a manufacturing step of the light emission device according to the embodiment.

As illustrated in FIG. 8, the plural second electrodes 114 are formed on the exposed areas of the contact layer 110 (i.e., on the areas of the contact layer 110 not having the first portions 116a). The second electrodes 114 are produced by vacuum deposition method or the like.

Figure 9:
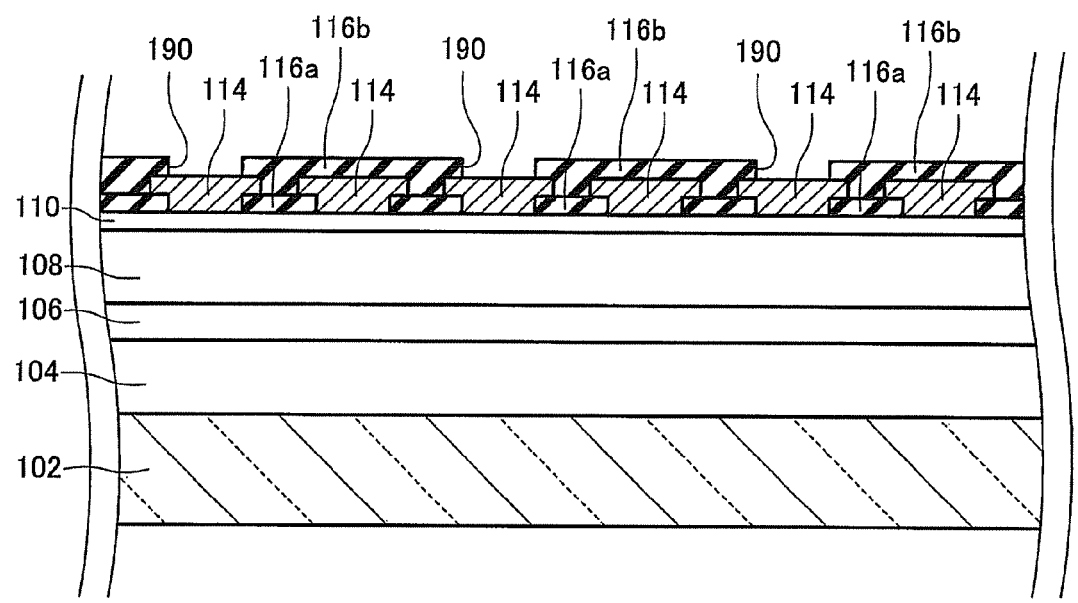
FIG. 9 is a cross-sectional view schematically illustrating a manufacturing step of the light emission device according to the embodiment.

As illustrated in FIG. 9, second parts 116b of the insulation portions 116 and the contact holes 190 are produced by providing an insulation layer (not shown) on the entire area and patterning the insulation layer. The contact holes 190 are formed in such a manner that the second electrodes 114 can be exposed through the contact holes 190.

Then, the common electrodes 180 and 182 are formed as illustrated in FIGS. 1 and 2. The common electrodes 180 and 182 are produced by vacuum deposition method, sputtering method, or plating method, for example. The first common electrode 180 is so constructed as to connect the plural second electrodes 114 positioned above the first gain areas 162 with one another. The second common electrode 182 is so constructed as to connect the plural second electrodes 114 positioned above the second gain areas 164 with one another. Then, the first electrode 112 is formed on the lower surface of the substrate 102. The first electrode 112 is produced by vacuum deposition method, for example. The first electrode 112 may be formed before the second electrodes 114 are produced.

Manufacture of the light emission device 100 is now completed by these steps.

According to the manufacturing method of the light emission device 100, the light emission device 100 capable of reducing speckle noise and providing high output can be produced.

3. Modified Examples of Light Emission Device

Light emission devices 200 and 300 according to modified examples of this embodiment are now described with reference to the drawings. According to the light emission devices 200 and 300, the same reference numbers are given to parts having functions similar to those of constituent parts of the light emission device 100 in this embodiment, and the same detailed explanation is not repeated.

(1) The light emission device 200 in a first modified example is initially explained. FIG. 10 is a plan view schematically illustrating the light emission device 200 in correspondence with FIG. 1. FIG. 10 does not show the insulation portions 116 for easy understanding of the figure.

As illustrated in FIG. 10, each set of the gain area sets 160 of the light emission device 200 has the first gain area 162, the second gain area 164, and a third gain area 266. The first gain area 162, the second gain area 164, and the third gain area 266 included in each set of the plural gain area sets 160 are disposed in this order in the second direction (+Y direction) in the plan view. The shape, function and the like of the third gain area 266 are similar to those of the first gain area 162 and the second gain area 164 described above.

The second electrodes 114 provided above the plural third gain areas 266 are electrically connected with one another by a third common electrode 284. According to the example shown in the figure, the third common electrode 284 is disposed between the first common electrode 180 and the second common electrode 182. However, the first common electrode 180, the second common electrode 182, and the third common electrode 284 may be positioned in this order in the first direction (+X direction), for example. The shape, function and the like of the third common electrode 284 are similar to those of the first common electrode 180 and the second common electrode 182 described above.

According to the light emission device 200 having the third gain areas 266, the distance between the adjoining first gain areas 162, for example, becomes longer than that of the light emission device 100. Thus, the effect of thermal interference can be further prevented or reduced.

Figure 11:
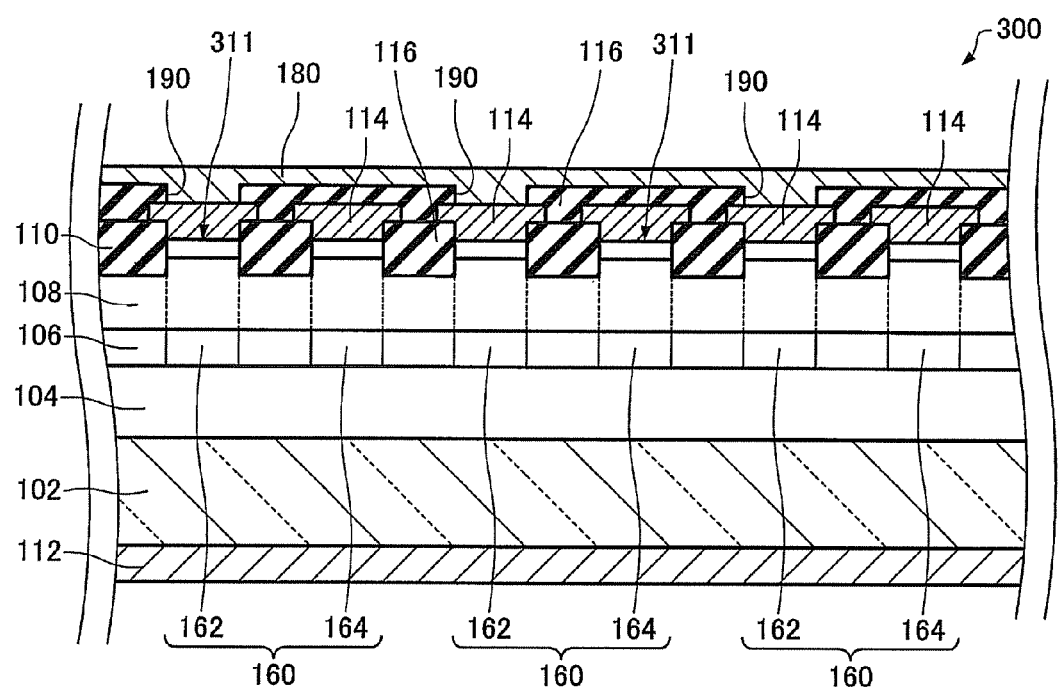
FIG. 11 is a cross-sectional view schematically illustrating a light emission device according to a second modified example of the embodiment.

(2) The light emission device 300 in a second modified example is now explained. FIG. 11 is a cross-sectional view schematically illustrating the light emission device 300 in correspondence with FIG. 2.

The light emission device 100 is an example of a so-called gain waveguide type. However, the light emission device 300 is of a so-called refractive index waveguide type.

According to the light emission device 300, columnar portions 311 are constituted by the contact layer 110 and a part of the second clad layer 108 as illustrated in FIG. 11. The plane shapes of the columnar portions 311 are the same as those of the gain areas 162 and 164. The current paths between the electrodes 112 and 114 are determined by the plane shapes of the columnar portions 311, for example, and the plane shapes of the gain areas 162 and 164 are determined based on the determined shapes of the current paths. Though not shown in the figure, the columnar portions 311 may be formed by parts containing the contact layer 110, the second clad layer 108, and the active layer 106, for example, or by parts further containing the first clad layer 104. In addition, the sides of the columnar portions 311 may be inclined.

The insulation portions 116 may be provided on the sides of the columnar portions 311. The insulation portions 116 may be positioned in contact with the side surfaces of the columnar portions 311. Current between the electrodes 112 and 114 can flow in the columnar portions 311 sandwiched between the insulation portions 116 while avoiding the insulation portions 116. The insulation portions 116 may have smaller refractive index than that of the active layer 106. In this case, lights can be efficiently confined within the gain areas 162 and 164 in the plane direction.

4. Projector

Figure 12:
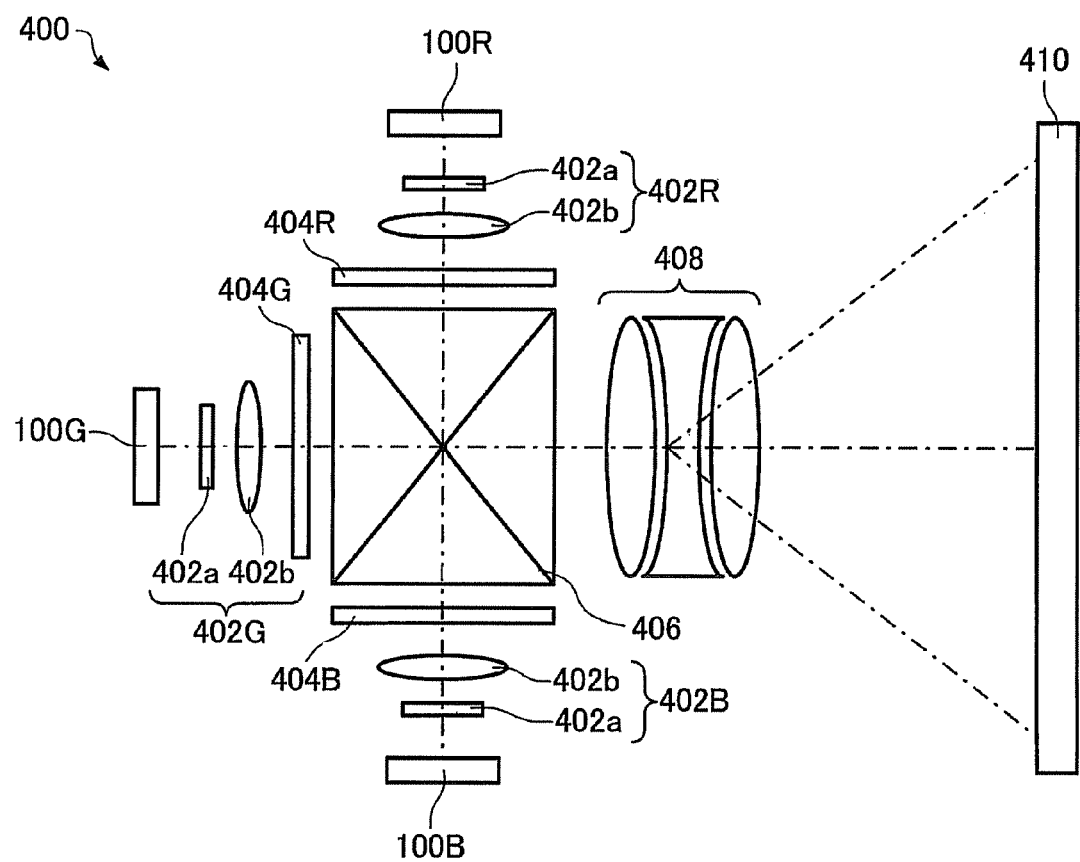
FIG. 12 schematically illustrating a projector according to the embodiment.

A projector 400 according to this embodiment is now described. FIG. 12 schematically illustrates the projector 400. FIG. 12 does not show a housing of the projector 400 for easy understanding of the figure. The projector 400 containing the light emission device 100 as an example of the invention is herein discussed.

The projector 400 has a red light source (light emission device) 100R, a green light source (light emission device) 100G, and a blue light source (light emission device) 100B, each of which is constituted by the light emission device 100 according to this embodiment.

The projector 400 includes transmission type liquid crystal light valves (light modulation devices) 404R, 404G, and 404B for modulating lights emitted from the light sources 100R, 100G, and 100B according to image information, a projection lens (projection device) 408 for expanding images formed by the liquid crystal light valves 404R, 404G, and 404B and projecting the expanded images on a screen (display surface) 410. The projector 400 may further include a cross dichroic prism (color combining unit) 406 for combining the lights received from the liquid crystal light valves 404R, 404G, and 404B and guiding the combined light to the projection lens 408.

The projector 400 further includes equalizing systems 402R, 402G, and 402B for equalizing illuminance distributions of lights emitted from the light sources 100R, 100G, and 100B at positions downstream from the respective light sources 100R, 100G, and 100B on the optical path, and applies lights having illuminance distributions equalized by the equalizing systems 402R, 402G, and 402B to the liquid crystal light valves 404R, 404G, and 404B. Each of the equalizing systems 402R, 402G, and 402B contains a hologram 402a and a field lens 402b, for example.

Three color lights modulated by the respective liquid crystal light valves 404R, 404G, and 404B enter the cross dichroic prism 406. This prism is produced by affixing four rectangular prisms, and contains a dielectric multilayer film for reflecting red light and a dielectric multilayer film for reflecting blue light disposed in a cross shape on the inner surface of the prism. The three color lights are combined by these dielectric multilayer films to form light representing a color image. Then, the combined light is projected on the screen 410 by the projection lens 408 as a projection system such that an expanded image can be displayed on the screen 410.

According to the projector 400, speckle noise can be reduced by the red light source 400R, the green light source 400G, and the blue light source 400B. Thus, a clear image can be displayed by the projector 400.

While the transmission type liquid crystal light valves are used as the light modulation devices in this example, light valves other than of liquid crystal type, or of reflection type may be employed. Examples of these light valves include reflection type liquid crystal light valves, digital micromirror devices and the like. The structure of the projection system may be changed according to the selected types of light valves as necessary.

Moreover, the light emission device 100 is applicable to a scanning-type image display apparatus (projector) including a scanning unit as an image forming device which displays images having a desired size on a display surface by applying light from the light emission device 100 to a screen for scanning.

The invention is not limited to the embodiment and the modified examples described herein only as examples. Thus, the embodiment and the modified examples can be combined, for example, for practicing the invention.

While the specific embodiment according to the invention has been described and depicted in detail, it is easily understood for those skilled in the art that various modifications and changes can be made without departing from the substantial scope of the invention for providing the novel points and advantages. As such, all modified examples of the embodiment are included in the scope of the invention.

What is claimed is:

1. A light emission device comprising:
a first clad layer;
an active layer disposed on the first clad layer;
a second clad layer disposed on the active layer;
a first electrode electrically connected with the first clad layer;
second electrodes electrically connected with the second clad layer, and
third electrodes electrically connected with the second clad layer and are different from the second electrodes;
wherein
the active layer forms a first gain area by sending current between the first electrode and the second electrode, the active layer forms a second gain area by sending current between the first electrode and the third electrode,
the first gain area and the second gain area extend from a one side while inclined to a vertical line of the one side in the plan view of the active layer,
the second electrodes are electrically connected with a first common electrode, the third electrodes are electrically connected with a second common electrode, and
the first gain area and the second gain area alternately emit light.

2. The light emission device according to claim 1, wherein:
the second electrodes contact a first contact layer allowing ohmic contact with the second electrodes;
the third electrodes contact a second contact layer allowing ohmic contact with the third electrodes; and
each plane shape of the first gain areas is the same as each plane shape of the contact surfaces of the second electrodes in contact with the first contact layer, and
each plane shape of the second gain area is the same as each plane shape of the contact surfaces of the third electrodes in contact with the second contact layer.

3. The light emission device according to claim 1, wherein:
the first common electrode and the second common electrode are conductive layers; and
the first common electrode and the second common electrode extend in a direction parallel to the one side in the plan view.

4. A method for driving the light emission device according to claim 1, the method comprising:
supplying voltage to the first common electrode such that lights can be emitted from respective end surfaces on the one side in the first gain area; and
stopping the supply of voltage to the first common electrode and supplying voltage to the second common electrode such that lights can be emitted from respective end surfaces on the one side in the second gain areas.

5. A projector comprising:
the light emission device according to claim 1;
a light modulation device which modulates light emitted from the light emission device according to image information; and
a projection device which projects an image formed by the light modulation device.

6. The light emission device according to claim 1, wherein:
the second electrodes and the third electrodes are alternately disposed.

* * * * *